United States Patent
Forbes

(10) Patent No.: US 7,601,593 B2
(45) Date of Patent: Oct. 13, 2009

(54) FLASH MEMORY WITH METAL-INSULATOR-METAL TUNNELING PROGRAM AND ERASE

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 427 days.

(21) Appl. No.: 11/486,597

(22) Filed: Jul. 14, 2006

(65) Prior Publication Data

US 2006/0258094 A1 Nov. 16, 2006

Related U.S. Application Data

(62) Division of application No. 10/881,662, filed on Jun. 30, 2004, now Pat. No. 7,436,020.

(51) Int. Cl.
*H01L 21/336* (2006.01)
(52) U.S. Cl. .................. 438/267; 257/320

(58) Field of Classification Search .......... 438/201, 438/211, 257, 267, 299, 593, 596; 257/315–317, 257/321, E21.209, E21.422, E29.129
See application file for complete search history.

(56) References Cited

U.S. PATENT DOCUMENTS

| | | | |
|---|---|---|---|
| 5,856,688 A * | 1/1999 | Lee et al. | 257/295 |
| 6,611,020 B2 | 8/2003 | Hai | |
| 6,674,118 B2 | 1/2004 | Yeh | |
| 6,754,108 B2 | 6/2004 | Forbes | |
| 6,775,175 B2 | 8/2004 | Thomas | |
| 6,788,574 B1 | 9/2004 | Han | |

\* cited by examiner

*Primary Examiner*—David Vu
(74) *Attorney, Agent, or Firm*—Leffert Jay & Polglaze, P.A.

(57) ABSTRACT

The flash memory cell comprises a sense transistor that has a pair of source/drain lines and a control gate. A coupling metal-insulator-metal capacitor is created between the control gate and a read wordline. A tunneling metal-insulator-metal capacitor is created between the control gate and a write/erase bit line. In one embodiment, the insulator is a metal oxide.

15 Claims, 4 Drawing Sheets

FLASH MEMORY WITH METAL-INSULATOR-METAL TUNNELING PROGRAM AND ERASE

TECHNICAL FIELD OF THE INVENTION

This application is a Divisional of U.S. patent application Ser. No. 10/881,662, filed Jun. 30, 2004 now U.S. Pat. No. 7,436,020 and titled, "FLASH MEMORY WITH METAL INSULATOR-METAL TUNNELING PROGRAM AND ERASE," which is commonly assigned and incorporated by reference in its entirety herein.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

FIG. 1 illustrates a cross-sectional view of a typical prior art memory cell having a metal-insulator-metal architecture. This cell has two source/drain regions 101 and 102 that are doped into a silicon substrate 100. A gate insulator layer 104 is formed over the channel between the source/drain regions 101 and 102. A polysilicon layer 106 and metal layer 107 make up the floating gate 120 that stores the charge for the cell. A metal oxide acts as the intergate insulator 108 between the floating gate 120 and the metal control gate 110.

In order to write data into the cell illustrated in FIG. 1, tunneling or hot electron injection would typically be used through the gate oxide 104. Tunneling or hot electron injection can cause a degradation of the transistor's characteristics, leading to read errors, after a number of program and erase cycles.

For the reasons stated above, and for other reasons stated below which will become apparent to those skilled in the art upon reading and understanding the present specification, there is a need in the art for a flash memory that reduces degradation due to program/erase cycles.

DETAILED DESCRIPTION

Figure 1:
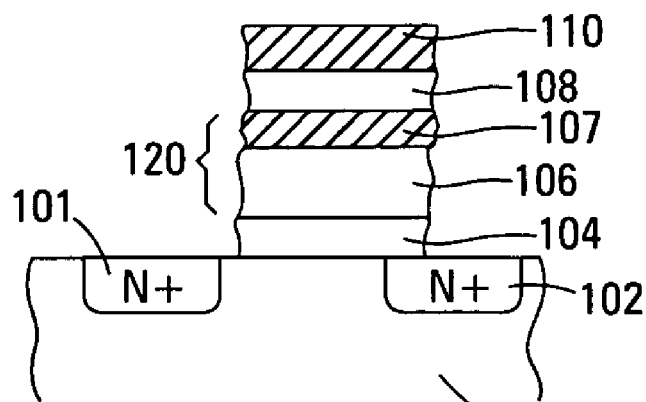
FIG. 1 shows a cross-sectional view of a typical prior art flash memory cell.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

Figure 2:
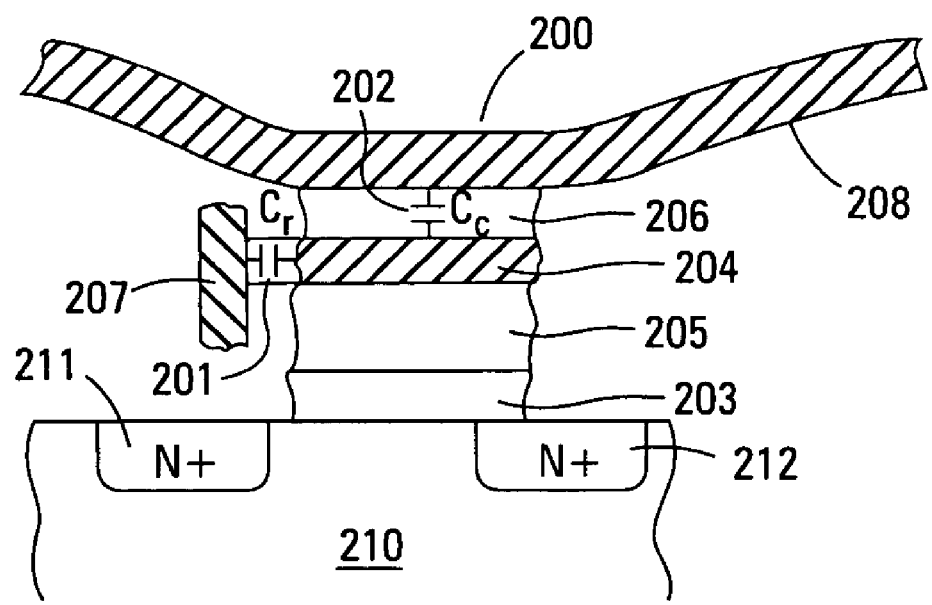
FIG. 2 shows a cross-sectional view of one embodiment of a flash memory cell transistor array of the present invention.

FIG. 2 illustrates a cross-sectional view of one embodiment of a flash memory device structure of the present invention. Each device is comprised of a sense field effect transistor (FET) 200 with a floating gate and two metal-insulator-metal tunneling capacitors 201 and 202.

The sense FET 200 is comprised of a substrate 210 with two source/drain regions 211 and 212. One of the source/drain regions can act as the read bit/data line 211 while the other source/drain region 212 may be used as a ground connection. In one embodiment, the source/drain regions 211 and 212 are n+ regions doped into a p-type silicon substrate 210. However, the present invention is not limited to any conductivity type or any one type of substrate. The source/drain regions 211 and 212 are coupled by a channel region in which a channel forms during operation of the transistor 200.

An oxide gate insulator 203 is formed on the substrate 210 over the channel region between the source/drain regions 211 and 212. A polysilicon layer 205 is deposited over the gate insulator 203. After definition and formation of this layer 203, a metal 204 is deposited on top of the polysilicon 205 to act as the floating gate of the transistor 200. In one embodiment, the metal layer 204 includes a barrier layer to prevent alloying of the metal 204 and polysilicon 205. The metal layer 204 is annealed if necessary to provide smooth top and edge surface areas.

A metal oxide layer 206 is next formed on the metal layer 204 using low temperature oxidation of the metal, atomic layer deposition (ALD), evaporation, or some other oxidation technique. Examples of such techniques for purposes of illustration are discussed subsequently. This metal oxide insulator 206 forms the coupling 202 $C_C$ and tunneling capacitor 201 $C_T$ dielectrics.

Metal is deposited 207 and directionally etched and left on the sidewalls only. This forms the tunneling capacitor 201 $C_T$. In one embodiment, the tunneling capacitor 201 is on both sides of the transistor 200. In an alternate embodiment, the metal is etched off to leave the metal 207 and tunneling capacitor on one side only. For purposes of clarity, the tunneling capacitor 201 of the embodiment of FIG. 2 is shown on one side only.

The metal oxide 206 can then be selectively etched from the top of the floating gate 204 and a new oxide formed on top of the floating gate 204 and the write/erase bit/data line 207 before the wordline metal 208 is deposited. This forms not only the coupling capacitor 202 $C_C$ but also provides electrical isolation between the metal write/erase bit/data line 207 and the read data wordline 208.

In operation, the tunneling capacitor, $C_T$, is a small area MIM capacitor. It has a small capacitance that may be in the range of 5-10% of the coupling capacitor $C_C$ that has a much larger area. A large voltage applied to the write/erase bit/data line 207 appears mostly across this small tunneling capacitor 202. Because of the voltage division on the capacitors 201 and 202, the read wordline 208 may also be biased at the same time to increase the voltage difference across the tunneling capacitor 201.

For example, the write/erase bit/data line 207 might be biased at −9V and the read wordline 208 at +3V. This would result in approximately 12V across the tunneling capacitor and an injection of electrons onto the floating gate, thus leaving it with a negative potential of approximately −1V. A coincident address is required to write or erase data onto the floating gate. Other cells that have only a bit/data line or wordline bias will not have a large enough voltage difference across the tunneling capacitor to cause the tunneling and/or change in data stored on the floating gate.

The cell of the present invention can be read by applying a read wordline voltage and determining the conductivity of the sense transistor 200. In one embodiment, the wordline voltage might be 3V. The above-described voltages are for purposes of illustration only. Alternate embodiments may use other voltages.

If a positive charge is stored on the floating gate, the transistor 200 will be highly conductive and is considered erased. If a negative charge is stored on the floating gate, the transistor will not conduct and is considered programmed.

The embodiments of the flash memory cell of the present invention can be used with a differential sense amplifier. It provides excellent discrimination in stored charges states and data. The write and erase operations can also be interrupted and the sense transistor used to monitor the progress of these operations. This enables multiple data bit storage on a single cell.

In forming the metal oxide layer 206, the oxide growth rate and limiting thickness increases with oxidation temperature and oxygen pressure. The oxidation kinetics of a metal may, in some cases, depend on the crystallographic orientations of the very small grains of metal that comprise the metal films of the present invention. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. Metal orientation effects, if present, would be larger when only a limited fraction of the metal will be oxidized and unimportant when most or all of the metal is oxidized.

Using a Pb/PbO/Pb structure, the Lead Oxide (PbO) barrier may be controllably grown on deposited lead films using either thermal oxidation or RF sputter etching in an oxygen plasma. One processing sequence using such a thermal oxidation process includes starting with a clean polysilicon substrate and depositing a clean lead film on the oxide gate insulator at about 25° C. to 75° C. in a clean vacuum system. In one embodiment, the base pressure is approximately 10−8 Torr or lower. The Pb film will have a thickness within 1-2 Å of its target value.

In one embodiment, lead and other metal films are deposited by a physical sputtering process. The sputtering process offers the ability to produce smoother films by increasing the re-sputtering-to-deposition ratio since re-sputtering preferentially reduces geometric high points of the film.

A low temperature oxidation process is then used to grow an oxide film of self-limited thickness. In one embodiment, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 Å as determined via in situ ellipsometric or ex situ measurements of Josephson tunneling currents. This control over tunnel current is due to the excellent control over PbO thickness that can be achieved by low temperature oxidation.

For example, increasing the oxidation time from 100 to 1,000 minutes at an oxygen pressure of 750 Torr at 25° C. only raises the PbO thickness by 3 Å (e.g., from about 21 Å to 24 Å). Accordingly, controlling the oxidation time to within 1 out of a nominal 100 minute total oxidation time provides a thickness that is within 0.1 Å of 21 Å. The PbO has a highly stoichiometric composition throughout its thickness as evidenced from ellipsometry and the fact that the tunnel barrier heights are identical for Pb/PbO structures.

Next, the system is re-evacuated and the top lead electrode is deposited. This produces a tunnel structure having virtually identical tunnel barriers at both Pb/O interfaces. The temperature used to subsequently deposit the polysilicon control gate is not critical. The PbO is stable to over 500° C. and thus introduces no temperature constraints on subsequent processes.

In another embodiment, Al/Al$_2$O$_3$ structures can be formed where the oxide is grown by low temperature oxidation in molecular or plasma oxygen. Capacitance and tunnel measurements indicate that the Al$_2$O$_3$ thickness increases with the log (oxidation time). This is similar to that found for Pb/PbO as well as other oxide/metal systems.

Additionally, tunnel currents for an Al$_2$O$_3$ tunnel barrier are asymmetrical with somewhat larger currents flowing when electrons are injected from the Al/Al$_2$O$_3$ interface that is developed during oxide growth. This asymmetry is due to a minor change in the composition of the growing oxide. There is a small concentration of excess metal in the Al$_2$O$_3$, the concentration of which diminishes as the oxide is grown thicker. The excess Al ions produce a space charge that lowers the tunnel barrier at the inner interface. The oxide composition at the outer Al/Al$_2$O$_3$ contact is much more stoichiometric and thus has a higher tunnel barrier. In spite of this minor complication, Al/Al$_2$O$_3$ tunneling barriers can be formed that produce predictable and highly controllable tunnel currents that can be ejected from either electrode. The magnitude of the currents is still primarily dominated by Al$_2$O$_3$ thickness that can be controlled via the oxidation parametrics.

In one embodiment of the present invention, Al$_2$O$_3$ metal oxide dielectrics can be formed by first thermally oxidizing the aluminum. In other embodiments, the aluminum is plasma oxidized or other oxidation methods can be used. Since the melting point of aluminum is much higher than lead, the formation of the Al/Al$_2$O$_3$ structures are typically simpler than that used for the above-described Pb/PbO junctions.

In the Al$_2$O$_3$ metal dielectric process of the present invention, the aluminum is sputter deposited on an oxide or other insulator at a temperature in the range of approximately 25° C. to 150° C. Due to thermodynamic forces, the micro-crystals of the face centered cubic (f.c.c.) aluminum will have a strong and desirable preferred orientation.

The aluminum is then oxidized in situ in molecular oxygen using temperature, pressure, and time to obtain the desired Al$_2$O$_3$ thickness. As with the lead oxide, the thickness of the aluminum increases with log (time) and can be controlled via time at a fixed oxygen pressure and temperature to within 0.10 Å when averaged over a large number of aluminum grains that are present under the counter-electrode. The thickness of the Al$_2$O$_3$ can be easily changed from about 15 Å to 35 Å by using appropriate oxidation parametrics. The oxide will be amorphous and remain so until temperatures in excess of 400° C. are reached. The initiation of re-crystallization and grain growth can be suppressed, if desired, by the addition of small amounts of glass forming elements (e.g., Si) without altering the growth kinetics or barrier heights significantly.

The system is then re-evacuated and a layer of aluminum is deposited over the oxidized Al$_2$O$_3$ layer. Finally, the polysilicon control gate layer is formed, using conventional processes that are well known in the art, on the layer of aluminum.

In the processes of the present invention, control over the properties of the various transition metal oxides is improved from the prior art due to the limited thicknesses (approximately 10 Å to 100 Å) of metal that precludes the formation of significant quantities of unwanted sub-oxide films. This is due to thermodynamic forces driving the oxide compositions to their most stable oxidized state. In one embodiment, the duplex oxide layers are still crystallized. Such treatments can be done by RTP and will be shorter than those used on MOCVD and sputter deposited oxides since the stoichiometry and purity of the low temperature oxides need not be adjusted at high temperatures.

The above-described processes for low temperature oxidation of various metals are for purposes of illustration only. The present invention is not limited to any one process for low temperature oxidation.

Single layers of Ta$_2$O$_5$, TiO$_2$, ZrO$_2$, Nb$_2$O$_5$ and similar transition metal oxides can be formed by low temperature oxidation of transition metal films in molecular and plasma oxygen. Examples of such operations are discussed subsequently. These metal oxide layers can also be formed by ALD, chemical vapor deposition (CVD), and RF sputtering.

These metals oxidize via logarithmic kinetics to reach thicknesses of a few angstroms to tens of thousands of angstroms in a temperature range of 100° C. to 300° C. Excellent oxide barriers for Josephson tunnel devices can be formed by RF sputter etching these metals in an oxygen plasma.

Lower temperature oxidation approaches of the present invention differ from Metal-Organic Chemical Vapor Deposition (MOCVD) processes that are used to produce transition metal oxides. The MOCVD films typically require high temperature oxidation treatments to remove carbon impurities, improve oxide stoichiometry, and produce re-crystallization. Such high temperature treatments might also cause unwanted interactions between the oxide and the underlying silicon and, thus, necessitate the introduction of interfacial barrier layers.

The embodiments of the present invention might also employ low temperature oxidation and short thermal treatments in an inert ambient atmosphere at 700° C. in order to form a range of perovskite oxide films from parent alloy films. The dielectric constants of crystallized perovskite oxides can be very large (i.e., 100 to 1000). The transition metal layers can be either pure metals or alloys and the transition metals have similar metallurgy to their oxides. In contrast, the parent alloy films that can be converted to a perovskite oxide are typically comprised of metals having widely different chemical reactivities with oxygen and other common gasses.

If an alloy is to be completely oxidized, then thin film barriers such as Pd, Pt, or their conductive oxides should be added between the silicon and the parent metal film to serve as electrical contact layers, diffusion barriers, and oxidation stops. If the perovskite parent alloy film is only partially oxidized and covered with a second layer of the parent alloy, then the barrier heights will represent that developed during oxide growth at the parent perovskite alloy/perovskite oxide interface.

As is well known in the art, ALD is based on the sequential deposition of individual monolayers or fractions of a monolayer in a well-controlled manner. Gaseous precursors are introduced one at a time to the substrate surface. Between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor.

The most commonly used oxygen source materials for ALD are water, hydrogen peroxide, and ozone. Alcohols, oxygen and nitrous oxide have also been used. Of these, oxygen reacts very poorly at temperatures below 600° C. but the other oxygen sources are highly reactive with most of the metal compounds listed above.

Source materials for the above-listed metals include: zirconium tetrachloride (ZrCl$_4$) for the Zr film, titanium tetraisopropoxide (Ti(OCH(CH$_3$)$_2$)$_4$) for the Ti film, trimethyl aluminum (Al(CH$_3$)$_3$) for the Al film. Alternate embodiments use other source materials.

In another embodiment of the memory transistor of the present invention, the metal floating gate and metal oxide insulator layers can be fabricated using evaporation techniques. Various evaporation techniques are subsequently described.

Very thin films of TiO$_2$ can be fabricated with electron-gun evaporation from a high purity TiO$_2$ slug (e.g., 99.9999%) in a vacuum evaporator in the presence of an ion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated TiO$_2$ film. An ion gun with a fairly large diameter (3-4 in. in diameter) is located above the electron gun and argon gas is used to generate Ar ions to bombard the substrate surface uniformly during the film deposition to compact the growing TiO$_2$ film.

A two step process in fabricating a high-purity ZrO$_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°-200° C.). Since there is no plasma and ion bombardment of the substrate, the original atomically smooth surface of the silicon substrate is maintained. The second step is the oxidation to form the desired $ZrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

A $CrTiO_3$ film can be created by first depositing a CoTi alloy film by thermal evaporation. The second step is the low temperature oxidation of the CoTi film at 400° C. Electron beam deposition of the CoTi layer minimizes the effect of contamination during deposition. The CoTi films prepared with an electron gun possess the highest purity due to a high-purity starting material. The purity of zone-refined starting metals can be as high as 99.9999% and higher purity can be obtained in deposited films because of further purification during evaporation.

Figure 3:
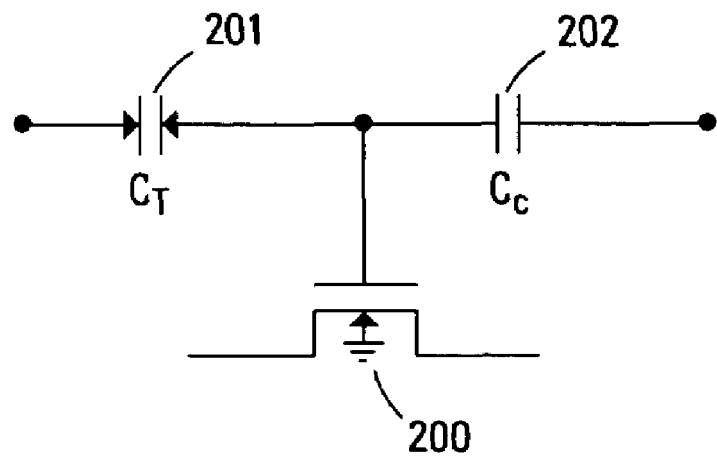
FIG. 3 shows a schematic diagram of one embodiment of an electrical equivalent circuit of the cell of FIG. 2.

FIG. 3 shows a schematic diagram of one embodiment of an electrical equivalent circuit of the cell of FIG. 2. This diagram shows the connections between the two capacitors 201 and 202 and the transistor 200.

Figure 4:
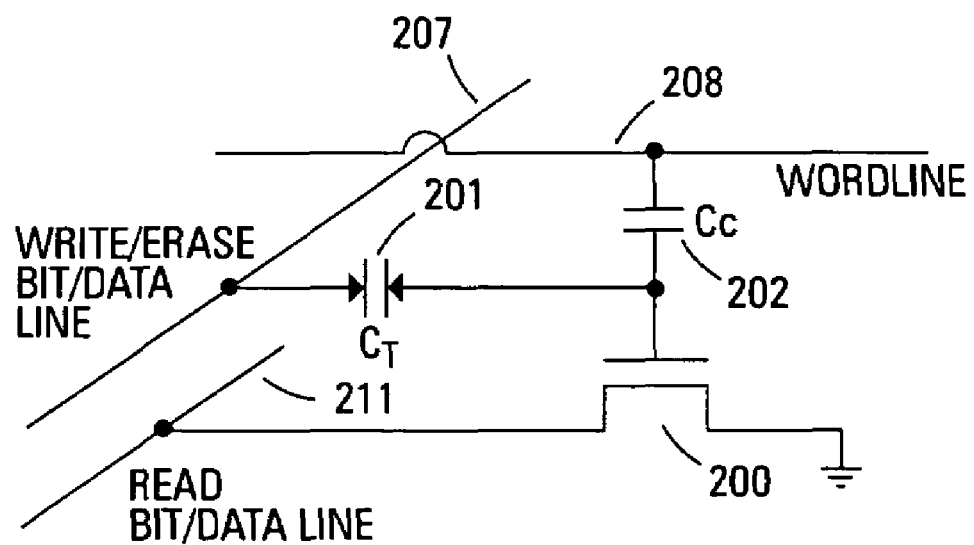
FIG. 4 shows a schematic diagram of one embodiment of an array configuration in accordance with the flash memory cell of FIG. 3.

FIG. 4 illustrates an electrical equivalent circuit of the flash memory device of FIG. 2 showing memory array connections. The illustrated embodiment is a NOR architecture memory device. The present invention, however, is not limited to NOR memory arrays. Alternate embodiments may use NAND architecture arrays or other types of flash memory architectures.

The circuit is comprised of the two MIM capacitors 201 and 202 and the transistor 200 as illustrated in FIG. 3. The coupling capacitor $C_C$ 202 is coupled to the wordline 208 of the array. The tunneling capacitor $C_T$ 201 is coupled to the write/erase bit/data line 207 of the array. One of the transistor's source/drain regions 211 is coupled to the array's read bit/data line 211. The remaining source/drain region 212 is coupled to ground. The array of FIG. 4 is in a NOR configuration. However, the embodiments of the present invention can also be arranged in the NAND configuration or some other flash configuration.

Figure 5:
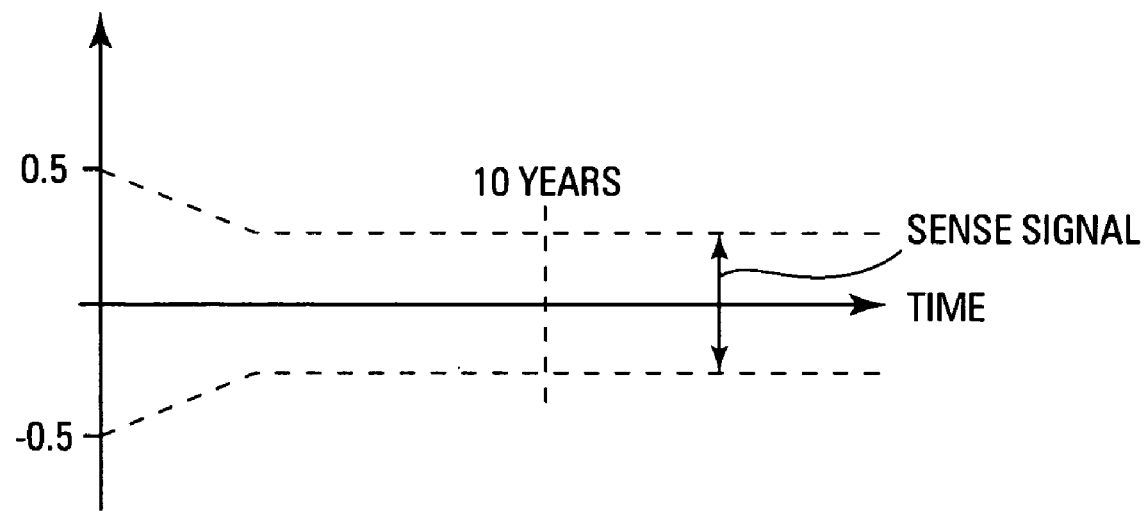
FIG. 5 shows a graph of one embodiment of the programmed cell characteristics versus time in accordance with the flash memory cell of FIG. 3.

FIG. 5 shows a graph of one embodiment of the programmed cell characteristics versus time in accordance with the flash memory cell of FIG. 3. This graph shows that, even when a charge leaks off of the capacitor in one of the possible charge states, a differential sense amplifier is still capable of reading valid data from the cell.

Figure 6:
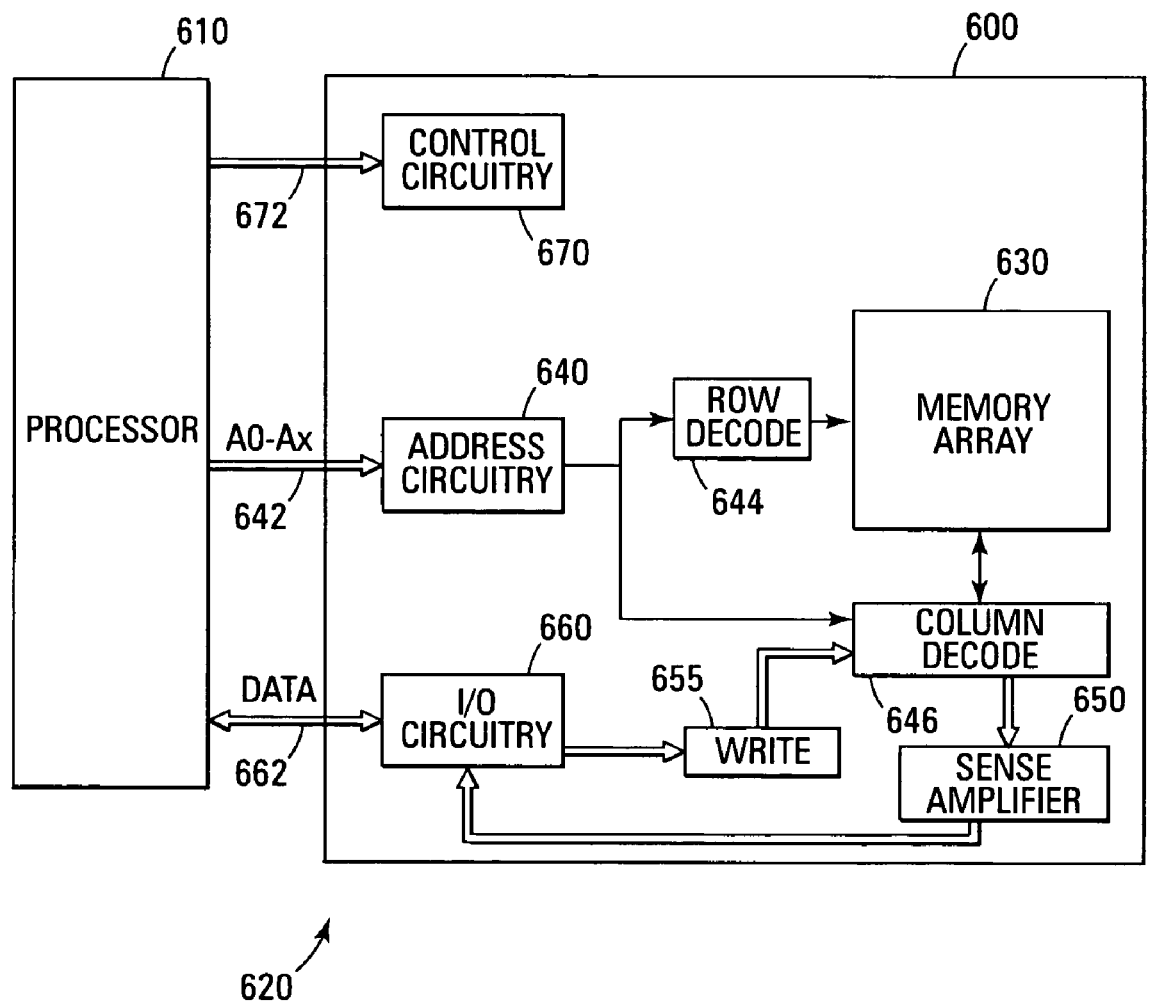
FIG. 6 shows a block diagram of an electronic system of the present invention.

FIG. 6 illustrates a functional block diagram of a memory device 600 that can incorporate the flash memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of flash memory cells 630 that can be the flash memory cells of the present invention that employ MIM tunneling. The memory array 630 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write (program), and erase operations. The control circuitry 670 may be a state machine, a sequencer, or some other type of controller.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, the flash memory cell embodiments of the present invention use CMOS technology to produce a memory cell that does not use semiconductor-oxide-polysilicon tunneling or channel hot electron injection over transistor gate insulators as done in the prior art. The present embodiments use two metal-insulator-metal (MIM) capacitors and one transistor. One MIM capacitor is used as a tunneling capacitor for both program and erase operations while the second MIM capacitor is a coupling capacitor between the control gate and the wordline. The present embodiments use only MIM tunneling.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a flash memory cell, the method comprising:
   forming a pair of source/drain regions in a substrate material;
   forming an oxide gate insulator layer over the substrate and substantially between the pair of source/drain regions;
   forming a floating gate layer over the gate insulator;
   forming a first metal oxide layer over the floating gate layer;
   depositing a metal layer that is directionally etched to leave a metal-insulator-metal tunneling capacitor on a sidewall of the cell;

selectively etching the first metal oxide layer to form an isolation layer between the tunneling capacitor and the metal layer;

forming a second metal oxide layer over the floating gate layer; and forming a metal wordline over the second metal oxide layer.

2. The method of claim 1 wherein the first and second metal oxide layers are formed by low temperature oxidation.

3. The method of claim 1 and further including annealing the floating gate layer to provide smooth top and edge surface areas.

4. The method of claim 1 wherein forming the floating gate layer includes forming a barrier layer to prevent alloying of the floating gate layer.

5. The method of claim 1 wherein forming the pair of source/drain regions includes doping the substrate to produce n+ source/drain regions.

6. The method of claim 1 wherein the metal control gate, second metal oxide layer, and metal wordline form a coupling metal-insulator-metal coupling capacitor.

7. The method of claim 6 wherein the coupling capacitor is comprised of a Pb/PbO/Pb structure and the PbO is formed by thermal oxidation.

8. The method of claim 6 wherein the coupling capacitor is comprised of an Al/Al$_2$O$_3$/Al structure and the Al$_2$O$_3$ is formed by low temperature oxidation.

9. The method of claim 1 wherein the second metal oxide layer is comprised of one of: Ta$_2$O$_5$, TiO$_2$, ZrO$_2$, or Nb$_2$O$_5$.

10. The method of claim 1 wherein the second metal oxide layer is formed by one of: thermal oxidation, atomic layer deposition, or evaporation.

11. A method for fabricating a memory cell, the method comprising:

forming a pair of source/drain regions in a substrate material; forming a gate insulator layer on the substrate and substantially between the pair of source/drain regions;

forming a charge storage layer on the gate insulator;

forming a first metal oxide layer on the charge storage layer;

forming a metal layer that is directionally etched to leave a metal-insulator-metal tunneling capacitor on a sidewall of the cell;

forming, from the first metal oxide layer, an isolation layer between the tunneling capacitor and the metal layer;

forming a second metal oxide layer on the charge storage layer; and forming a metal wordline on the second metal oxide layer.

12. The method of claim 11 wherein an oxide growth rate of the first and second metal oxide layers increases with oxidation temperature and oxygen pressure.

13. The method of claim 11 wherein a limiting thickness of the first and second metal oxide layers increases with oxidation temperature and oxygen pressure.

14. The method of claim 11 wherein the metal layer is deposited using a sputtering process.

15. The method of claim 11 and further including annealing the metal layer.

* * * * *

UNITED STATES PATENT AND TRADEMARK OFFICE
CERTIFICATE OF CORRECTION

PATENT NO. : 7,601,593 B2
APPLICATION NO. : 11/486597
DATED : October 13, 2009
INVENTOR(S) : Leonard Forbes It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 518 days.

Signed and Sealed this

Fifth Day of October, 2010

David J. Kappos
*Director of the United States Patent and Trademark Office*